United States Patent
Iwabuchi et al.

(10) Patent No.: US 9,596,771 B2
(45) Date of Patent: Mar. 14, 2017

(54) CONTROLLING APPARATUS (71) Applicant: Azbil Corporation, Tokyo (JP)

(72) Inventors: Yukio Iwabuchi, Tokyo (JP); Ken Iwakiri, Tokyo (JP); Yoshiyuki Matsumura, Tokyo (JP)

(73) Assignee: Azbil Corporation, Tokyo (JP)

( * ) Notice: Subject to any disclaimer, the term of this patent is extended or adjusted under 35 U.S.C. 154(b) by 0 days.

(21) Appl. No.: 14/872,304

(22) Filed: Oct. 1, 2015

(65) Prior Publication Data
US 2016/0100492 A1 Apr. 7, 2016

(30) Foreign Application Priority Data

Oct. 1, 2014 (JP) .................................. 2014-202799

(51) Int. Cl.
*H02B 1/20* (2006.01)
*H05K 5/00* (2006.01)

(52) U.S. Cl.
CPC .................................. *H05K 5/0017* (2013.01)

(58) Field of Classification Search
CPC .......... H04Q 1/14; H02B 1/202; A47B 21/06; A47B 21/066; H01R 12/62
USPC ........... 361/679.01, 748, 752, 728–730, 827; 439/215, 449, 460, 469, 214
See application file for complete search history.

(56) References Cited

U.S. PATENT DOCUMENTS

| | | | | |
|---|---|---|---|---|
| 4,532,513 A * | 7/1985 | Halvorson | ........... | H05K 7/1427 312/7.2 |
| 4,966,004 A * | 10/1990 | Midlang | ............... | F25D 29/005 200/302.2 |
| 5,179,492 A * | 1/1993 | Kato | ...................... | H02H 9/004 307/127 |
| 9,323,082 B2 * | 4/2016 | Tannas, Jr. | ............. | B60K 35/00 |
| 2004/0118620 A1 * | 6/2004 | Fringeli | ............... | G01G 21/283 177/180 |
| 2007/0267554 A1 * | 11/2007 | Tannas, Jr. | ............. | B60K 35/00 248/205.1 |
| 2008/0158792 A1 * | 7/2008 | Itoh | ..................... | B60R 11/0205 361/724 |

OTHER PUBLICATIONS

Japanese Application No. 2014-202799, filed Oct. 1, 2014.
Azbil Corporation, "Specification for SDC25/26 Single Loop Controller", No. CP-SS-1819, pp. 1-12.

* cited by examiner

*Primary Examiner* — Hung S Bui
(74) *Attorney, Agent, or Firm* — Amster, Rothstein & Ebenstein, LLP (57) ABSTRACT

A display and operating unit and a main unit are connected with the ability to be separated. In a state with the connection with the main unit separated, the display and operating unit is attached to the front surface side of a panel. In this case, the connector cable is passed through an opening formed on the panel and positioned at the back surface side of the panel, and packing is positioned so as to enclose the periphery of the opening, and the display and operating unit is attached to the front surface side of the panel. Then, the main unit is fixed to the back surface side of the panel, a connector $CN_1$ of the tip end of the connector cable is engaged with a connector of the main unit, and the display and operating unit and the main unit are connected.

4 Claims, 8 Drawing Sheets

CONTROLLING APPARATUS

CROSS-REFERENCE TO RELATED APPLICATION

The present application claims the benefit of and priority to Japanese Patent Application No. 2014-202799, filed on Oct. 1, 2014, the entire contents of which are incorporated herein by reference.

TECHNICAL FIELD

The present invention relates to a control device such as an indicator controller or the like.

BACKGROUND ART

Figure 7:
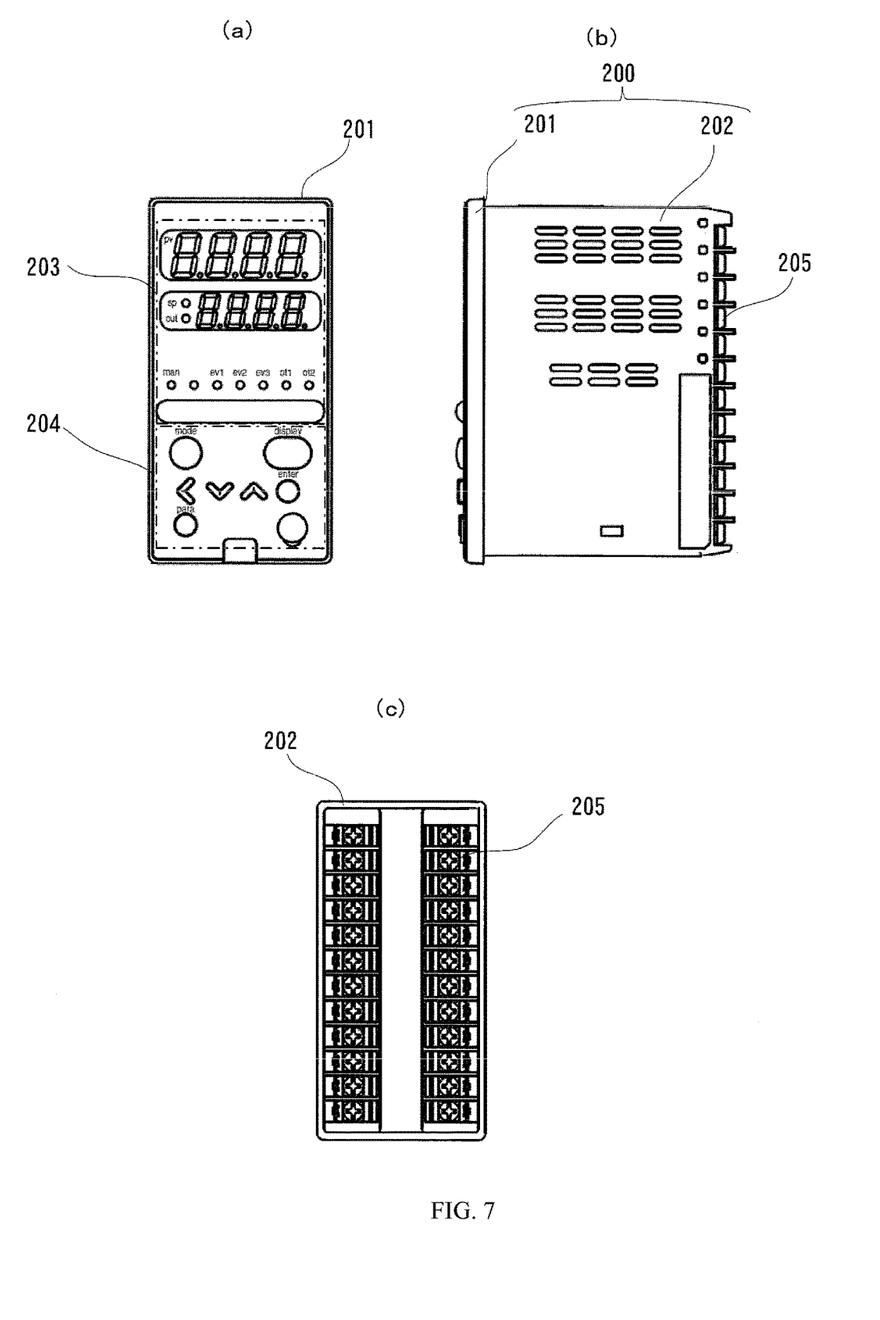
FIG. 7 is a front view, a side view, and a back view showing an example of a conventional indicator controller.

From the past, as a control device that controls items such as temperature, humidity, pressure, flow volume and the like, and that displays controlled variables such as temperature, humidity, pressure, flow volume and the like, an indicator controller equipped with a display part and an operating part has been used. FIG. 7 shows an example of a conventional indicator controller. FIGS. 7 (a), (b), and (c) are a front view, side view, and back view of a conventional indicator controller.

This indicator controller 200 is equipped with a display and operating unit 201 and a main unit 202, and the display and operating unit 201 and the main unit 202 are an integrated unit. Provided on the display and operating unit 201 are a display part 203 that displays controlled variables such as temperature, humidity, pressure, flow volume and the like, and an operating part 204 that makes it possible to input setting values for controlled variables such as temperature, humidity, pressure, flow volume and the like. Circuit parts such as a control calculation circuit and the like are housed in the main unit 202. Also, provided on the back surface of the main unit 202 is a terminal part 205 to which input/output signal lines of the power source, various types of sensors and the like are connected.

This indicator controller 200 is used for plant monitoring control and the like, and is used attached to a panel such as a control panel or the like. In this case, so as to be able to be used in an environment requiring regular cleaning or an environment such as one for which there is a great deal of dust or the like, water proofing and dust proofing functions are desired for the indicator controller 200.

Figure 8:
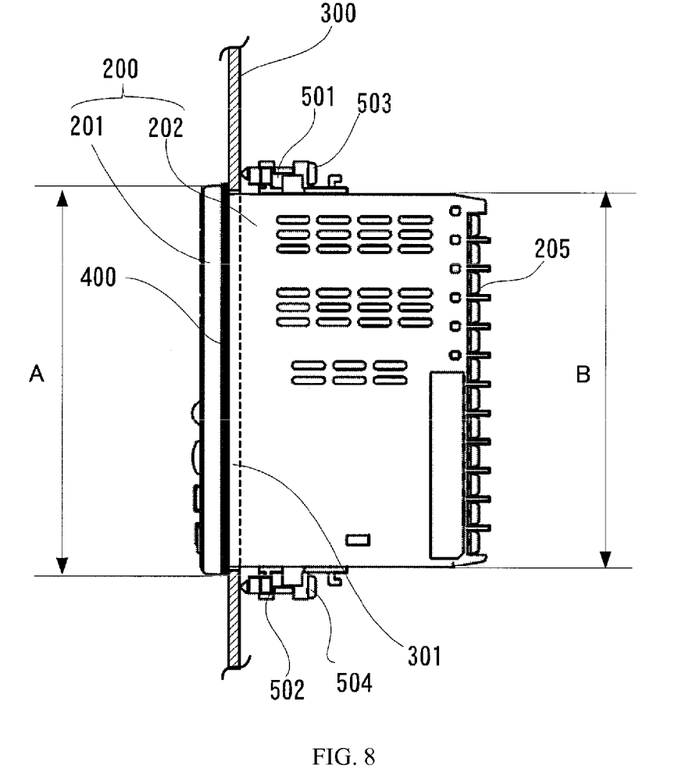
FIG. 8 is a drawing showing the attachment structure of the conventional indicator controller to the panel.
Figure 9:
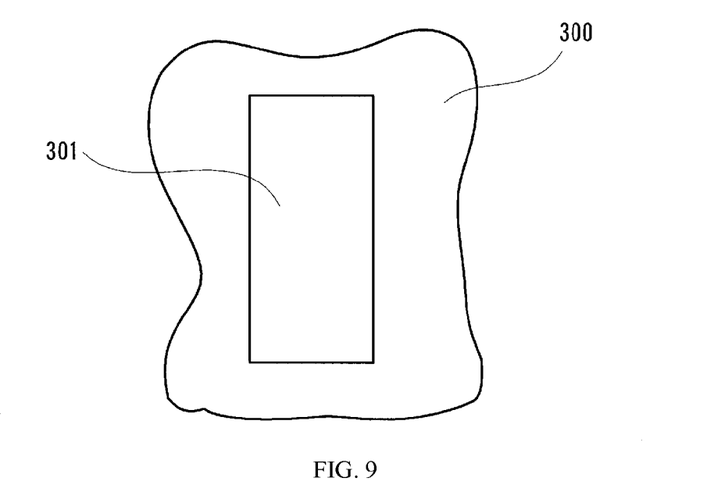
FIG. 9 is a drawing showing the opening formed on the panel with the attachment structure of the conventional indicator controller to the panel.

FIG. 8 shows the attachment structure of this indicator controller 200 to the panel 300. With this attachment structure, an opening 301 for attachment to the panel 300 is formed (see FIG. 9), the main unit 202 is passed through this opening 301 and positioned at the back surface side of the panel 300, and packing 400 made to enclose the periphery of the opening 301 is positioned between the display and operating unit 201 and the panel 300, and the indicator controller 200 is attached to the panel 300 by fastening screws 503 and 504 of attachment fittings 501 and 502 provided above and below the main unit 202 on the back surface side of the panel 300. By doing this, the packing 400 is gripped and pressed by the display and operating unit 201 and the panel 300, the gap between the display and operating unit 201 and the panel 300 is plugged, and water proofing and dust proofing functions are guaranteed (e.g. see Non-Patent Document 1).

PRIOR ART LITERATURE

Patent Literature

[Non-Patent Literature 1] "Digital Indicator controller, SDC25/26, User Manual, Details," Searched on Aug. 5, 2014, Internet <URL: https://www.compoclub.com/app/model/Download.do?kind=manual&downloadFileName=CP-SP-1149-19.pdf&docNo=CP-SP-1149&modelNumber=C25&unitModelNumber=DUMMY>

SUMMARY OF THE INVENTION

Problems that the Invention is to Solve

However, since the typical indicator controller complies with DIN (Deutsche Industrie Norme) standards, the size of the display and operating unit (part A in FIG. 8) is the same for all companies. There is a slight difference in the main unit size (part B in FIG. 8) depending on the manufacturer, but in order to ensure the packing dimensions, being shorter than part A is common to all. Meanwhile, to ensure wiring space of the input/output signal lines, and ensure parts mounting space and the like, it is preferable that part B be as large as possible. As a result of making part B as large as possible in a state of not being able to change the dimension of part A, with the attachment structure of the indicator controller to the panel in the past, problems such as (1) and (2) noted below occurred with the water proofing and dust proofing functions.

(1) To guarantee the water proofing and dust proofing functions, as the opening for attachment of the indicator controller, it was necessary to form a rectangular hole for which processing is more difficult than a round hole (rectangular hole matched to the shape of the main unit) on the panel with high precision.

Figure 10:
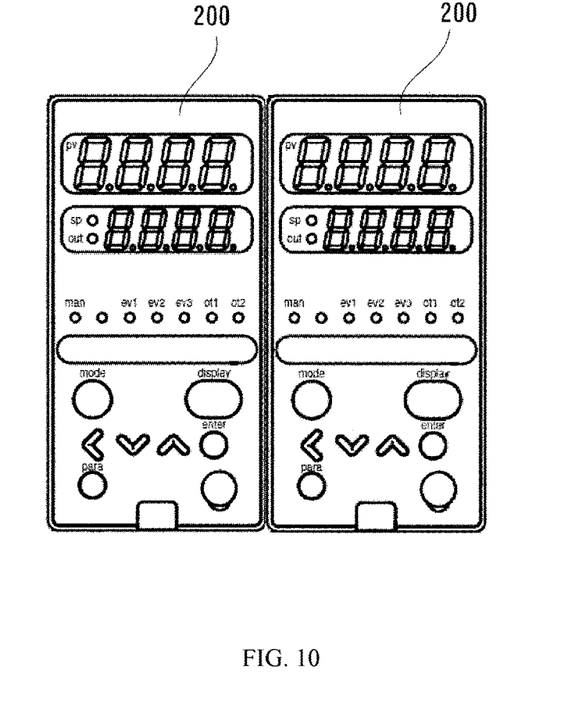
FIG. 10 is a drawing showing the state with two indicator controllers mounted in close contact.
Figure 11:
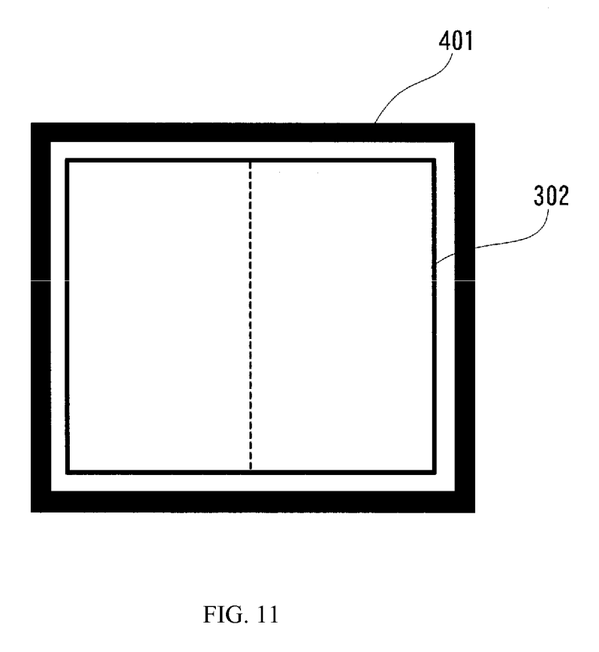
FIG. 11 is a drawing showing the mounting hole recommended when doing close contact mounting of two indicator controllers.

(2) For example, when doing close contact mounting of two indicator controllers 200 as shown in FIG. 10, the manufacturer recommends a mounting hole 302 in which two indicator controllers 200 will fit as shown in FIG. 11. However, since there is no panel for gripping and pressing the packing 401 at the center part to which the two indicator controllers 200 are adjacent (the part shown by the dotted line in FIG. 11), positioning is not possible. Because of this, it is not possible to guarantee the water proofing and dust proofing functions.

The present invention was created to address this kind of problem, and an object is to provide a control device that does not require forming of an opening for attachment with high precision on a panel, and for which it is possible to guarantee water proofing and dust proofing functions even when doing close contact mounting of the control device.

Means for Solving the Problems

To achieve this kind of object, the present invention is a control device comprising a display and operating unit equipped with at least one of a display part and an operating part, and a main unit connected so as to be able to separate from this display and operating part, wherein the display and operating part, in a state with the connection with the main unit separated, has a connecting part with the main unit passed through an opening formed on a panel and positioned on a back surface side of the panel, has packing positioned so as to enclose the periphery of the opening with the panel, and has attachment to the front surface side of the panel done so as to have the packing gripped and pressed by the display and operating unit and the panel, and the main unit is connected at the back surface side of the panel to the display and operating unit attached in a state separated at the front surface side of the panel.

With the present invention, rather than the display and operating unit and the main unit being an integrated unit, the constitution is such that they are connected with the ability to separate. With the present invention, when attaching the control device equipped with the display and operating unit and the main unit connected to be able to be separated to the panel, the display and operating unit is attached to the front surface side of the panel in a state with the connection with the main unit separated. In this case, the connecting part of the display and operating unit with the main unit is passed through an opening formed on the panel and positioned at the back surface side of the panel, packing is positioned so as to enclose the periphery of the opening between the display and operating unit and the panel, the packing is gripped and pressed by the display and operating unit and the panel, and the display and operating unit is attached to the front surface side of the panel. Also, the main unit is connected at the back surface side of the panel to the display and operating unit attached in a state separated at the front surface side of this panel.

With the present invention, attachment to the panel is done in a state with the display and operating unit and the main unit separated, so it is sufficient to form on the panel an opening through which the connecting part of the display and operating unit with the main unit passes through. For example, when the connecting part of the operating unit with the main unit is a connector cable, it is sufficient to form on the panel an opening through which this connector cable can pass. By doing this, the shape of the opening formed on the panel is not limited to the shape of the main unit, and it does not have to be a high precision rectangular hole that matches the shape of the main unit. Also, the size of the opening formed on the panel is sufficient as long as it is a size through which the connector cable can pass, and it is possible to have an opening that is sufficiently smaller than the display and operating unit. By having the opening be sufficiently smaller than the display and operating unit, when doing close contact mounting of the control device, packing is positioned so as to enclose the periphery of the opening for attaching to each respective control device, and it is possible to guarantee water proofing and dust proofing functions.

With conventional control devices, the shape of the opening formed on the panel was dependent on the shape of the main unit, and because it was not possible to make the opening formed on the panel smaller than the main unit, the problems (1) and (2) described above occurred. With the present invention, the shape of the opening formed on the panel is not limited to the shape of the main unit, so it is possible to resolve problems like (1) and (2) described above. Specifically, the present invention focused on having the display and operating unit and the main unit separated as a method that would allow design without limiting the shape of the opening formed on the panel to the shape of the main unit, and by attaching the display and operating unit to the panel in a state with the connection with the main unit separated, and connecting the main unit at the back surface side of the panel to the display and operating unit attached to the panel in this separated state, it is possible to design the shape of the opening formed on the panel without limiting it to the shape of the main unit.

With the present invention, rather than a connector cable for the connecting part of the display and operating unit with the main unit, connectors can also be used. In this case, at the back surface side of the panel, when the display and operating unit and the main unit are connected by connectors engaging with each other, the connector cable becomes unnecessary.

Also, with the present invention, it is sufficient as long as the display and operating unit is equipped with at least one of the display part and the operating part. Specifically, with the present invention, the display and operating unit is not limited to a constitution equipped with a display part and an operating part, but also includes a constitution equipped with only the operating part and a constitution equipped with only the display part. When the constitution is equipped with only the display part, the display and operating unit can be read instead as the display part, and when it is a constitution equipped with only the operating part, the display and operating unit can be read instead as the display part. Also, with the present invention, the control device is not limited to being an indicator controller.

Effect of the Invention

With the present invention, in a state with the display and operating unit separated from its connection with the main unit, the connecting part with the main unit is passed through the opening formed on the panel and positioned at the back surface side of the panel, packing is positioned so as to enclose the periphery of the opening with the panel, and the packing is gripped and pressed by the display and operating unit and the panel, attachment is to the front surface side of the panel, and the main unit is connected at the back surface side of the panel to the display and operating unit attached in a state separated at the front surface side of the panel, so it is possible to make it so the shape of the opening formed on the panel is not limited to the shape of the main unit. By doing this, it is possible to eliminate the necessity of doing high precision formation of the opening for attachment on the panel, and with an opening that is sufficiently smaller than the display and operating unit, even when doing close contact mounting of the control device, it is possible to guarantee water proofing and dust proofing functions.

MODES FOR CARRYING OUT THE INVENTION

Figure 1:
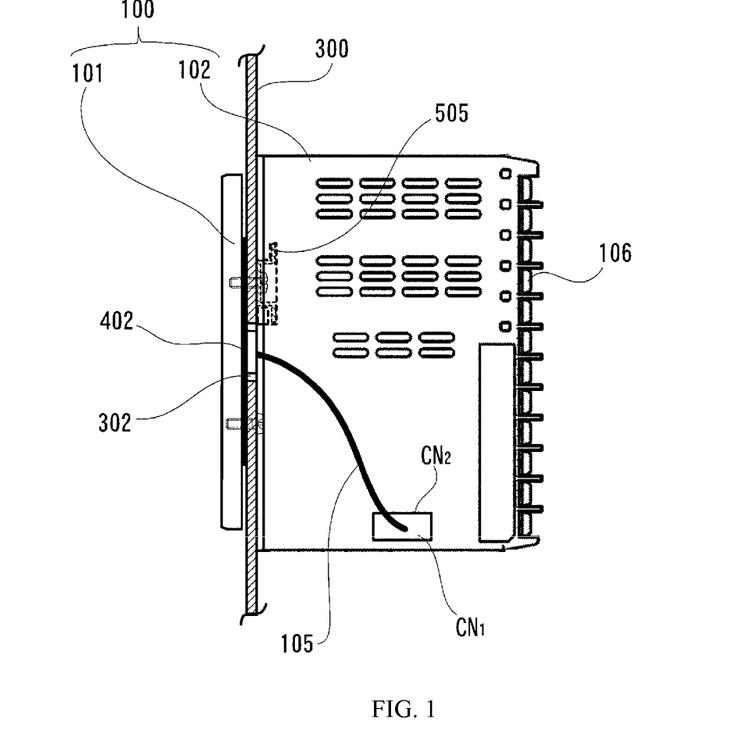
FIG. 1 is a drawing showing one embodiment of the control device of the present invention.

Following, we will give a detailed description of embodiments of the present invention based on the drawings. FIG. 1 is a drawing showing one embodiment of the control device of the present invention, in the drawing, 100 is an indicator controller attached as the control device of the present invention to a panel 300, and it is constituted from a display and operating unit 101 and a main unit 102.

Figure 2:
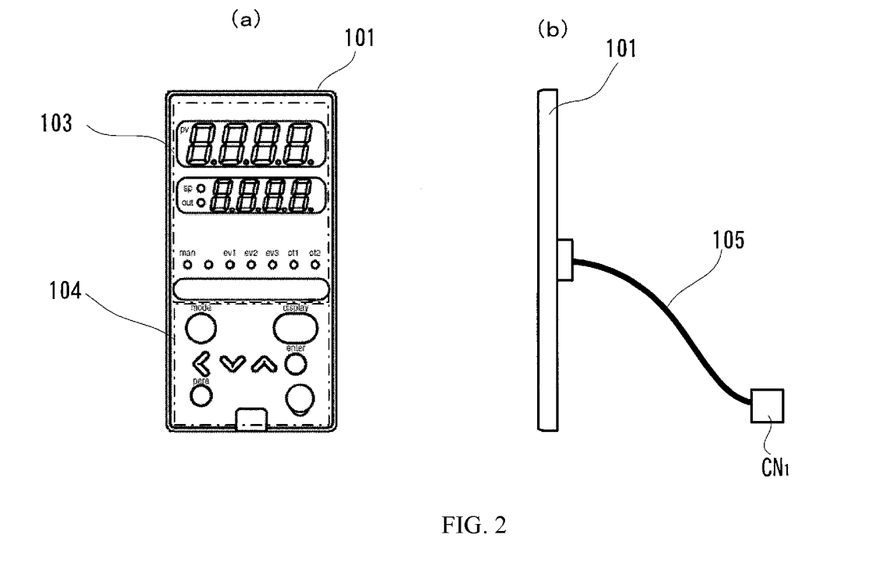
FIG. 2 is a front view and side view of the display and operating unit attached to the front surface side of the panel in FIG. 1.

FIG. 2 (a) shows a front view of the display and operating unit 101, and FIG. 2 (b) shows a side view of the display and operating unit 101. Provided on the display and operating unit 101 are a display part 103 for displaying controlled variables such as temperature, humidity, pressure, flow volume and the like, and an operating part 104 that makes possible input of setting values for the controlled variables such as temperature, humidity, pressure, flow volume and the like. Also, this display and operating unit 101 is connected so as to be separable with the main unit 102, and a connector cable 105 is provided as the connecting part with the main unit 102. At the tip end of the connector cable 105 is provided a connector $CN_1$ as a part of the connector cable 105.

Figure 3:
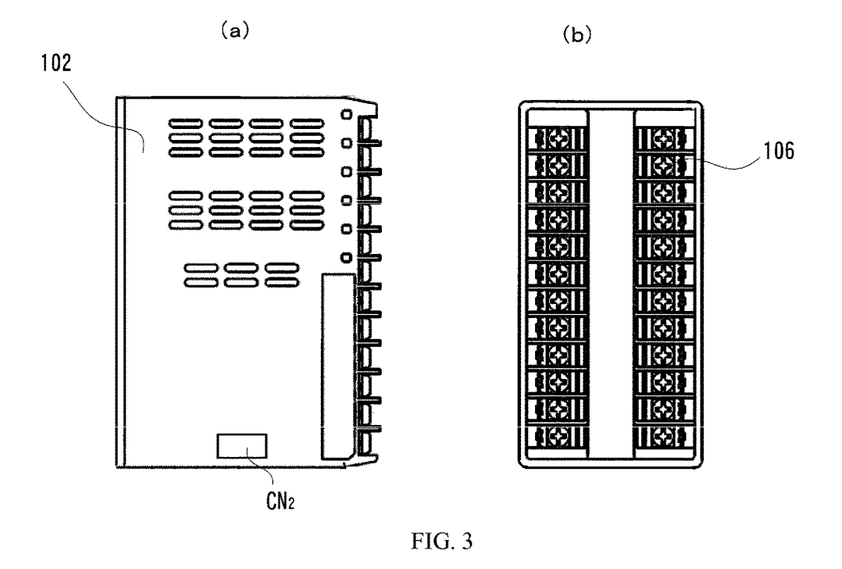
FIG. 3 is a side view and back view of the main unit connected to the display and operating unit fixed to the back surface side of the panel in FIG. 1.

FIGS. 3 (a) and (b) show the side view and back view of the main unit 102. Circuit parts such as a control calculation circuit and the like are housed in the main unit 102. Also, at the back surface of the main unit 102 is provided a terminal part 106 to which are connected input/output signal lines such as of the power supply, various types of sensors and the like. This main unit 102 is connected to be able to be separated with the display and operating unit 101, and a connector $CN_2$ is provided as the connecting part with the display and operating unit 101.

Figure 4:
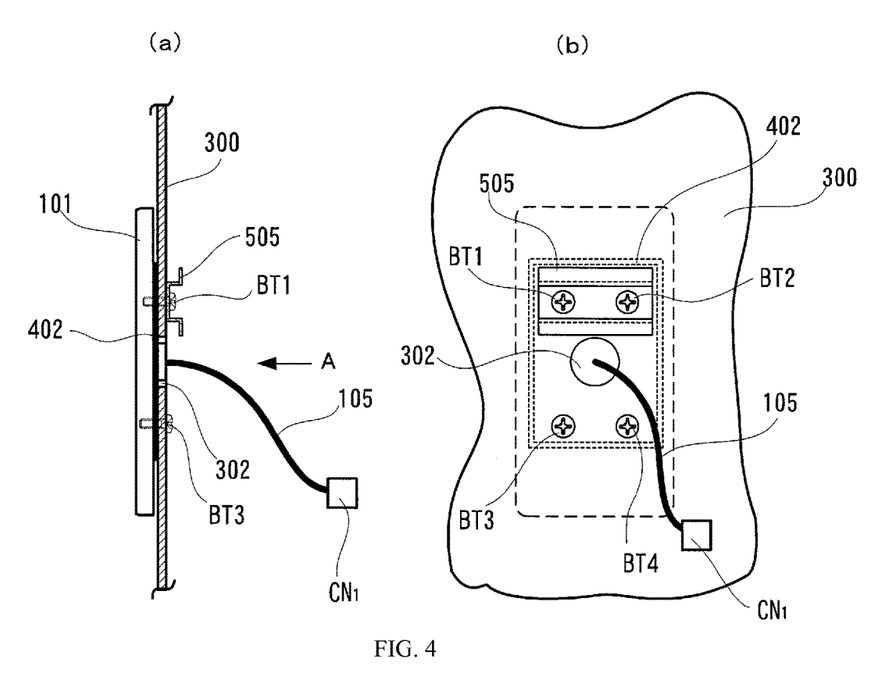
FIG. 4 is a drawing showing the attached state on the display and operating unit to the panel.

When attaching this indicator controller 100 to the panel 300, first, in a state with the connection with the main unit 102 separated, the display and operating unit 101 is attached to the front surface side of the panel 300. FIG. 4 shows the attachment state on the display and operating unit 101 to the panel 300. FIG. 4 (a) is a side view, and FIG. 4 (b) is a drawing with FIG. (a) viewed from the arrow A direction. Panel 300 is shown in cross section in FIG. 4 (a).

In this case, an opening 302 of a size for which the connector cable 105 can pass through is formed on the panel 300, the connector cable 105 is passed through this opening 302 and positioned on the back surface side of the panel 300, packing 402 is positioned so as to enclose the periphery of the opening 302 with the panel 300, and screws BT1 to BT4 are fastened on the display and operating unit 101 from the back surface side of the panel 300. By doing this, the packing 402 is made to be gripped and pressed by the display and operating unit 101 and the panel 300, and the display and operating unit 101 is attached to the front surface side of the panel 300. Also, simultaneous with attaching of the display and operating unit 101 to the panel 300, with a DIN rail (metal rail) 505 as the attachment fitting for the main unit 102, fixing to the back surface side of the panel 300 is done using screws BT1 and BT2.

Then, as shown in FIG. 1, the main unit 102 is made to hang on the DIN rail 505 and is fixed to the back surface side of the panel 300. Then, the connector $CN_1$ of the tip end of the connector cable 105 of the display and operating unit 101 is engaged with the connector $CN_2$ of the main unit 102, and the display and operating unit 101 (display and operating unit 101 attached in a state separated at the front surface side of the panel 300) and the main unit 102 (main unit 102 fixed to the back surface side of the panel 300) are connected.

Working in this way, with this embodiment, attachment to the panel 300 is done in a state with the display and operating unit 101 and the main unit 102 separated, so it is sufficient to simply form an opening 302 through which the connector cable 105 can pass on the panel 300. By doing this, the shape of the opening 302 formed on the panel 300 is not restricted to the shape of the main unit 102, and it is not necessary to have the opening 302 be a high precision rectangular hole matching the shape of the main unit 102. With this embodiment, the shape of the opening 302 is a circular hole for which processing is simple.

Also, the opening 302 formed on the panel 300 is sufficient as long as it is a size through which the connector cable 105 can pass, and it is possible to have an opening that is sufficiently smaller than the display and operating unit 101. By doing this, when doing close contact mounting of the indicator controller 100, packing 402 is positioned so as to enclose the opening 302 for attachment on the respective indicator controller 100, and it is possible to guarantee the water proofing and dust proofing functions.

With the embodiment described above, the connecting part of the display and operating unit 101 with the main unit 102 was a connector cable 105, but it can also be connectors. Specifically, it is also possible to directly provide a connector on the display and operating unit 101, and to connect the display and operating unit 101 and the main unit 102 by mutually engaging the connectors at the back surface side of the panel 300. By doing this, the connector cable 105 is unnecessary.

Also, with the embodiment described above, the main unit 102 was fixed directly in back of the display and operating unit 101 sandwiching the panel 300, but the main unit 102 does not necessarily have to be fixed directly in back of the display and operating unit 101 sandwiching the panel 300, and can also be fixed to a position of the back surface of the panel 300 separated from the display and operating unit 101. Also, the main unit 102 can also be installed at a position on the back surface side of the panel 300 separated from the panel 300.

Figure 5:
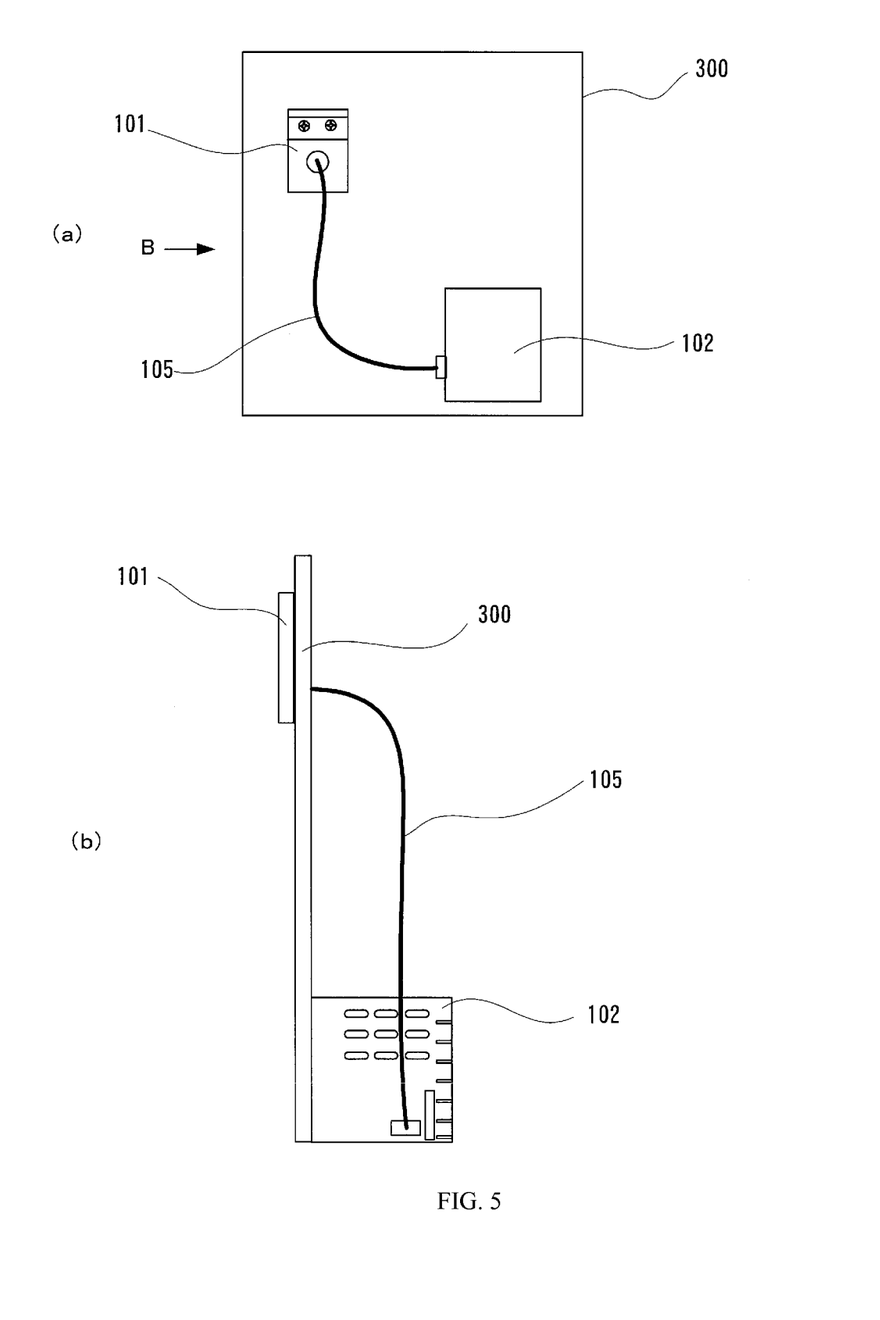
FIG. 5 is a drawing showing an example for which the main unit is fixed at a position separated from the display and operating unit on the back surface of the panel.

FIG. 5 shows an example with the main unit 102 installed at a position of the back surface of the panel 300 separated from the display and operating unit 101. FIG. 5 (a) is a drawing of the relationship between the display and operating unit 101 and the main unit 102 seen from the back surface side of the panel, and FIG. 5 (b) is a drawing of FIG. 5 (a) viewed from the B direction.

Figure 6:
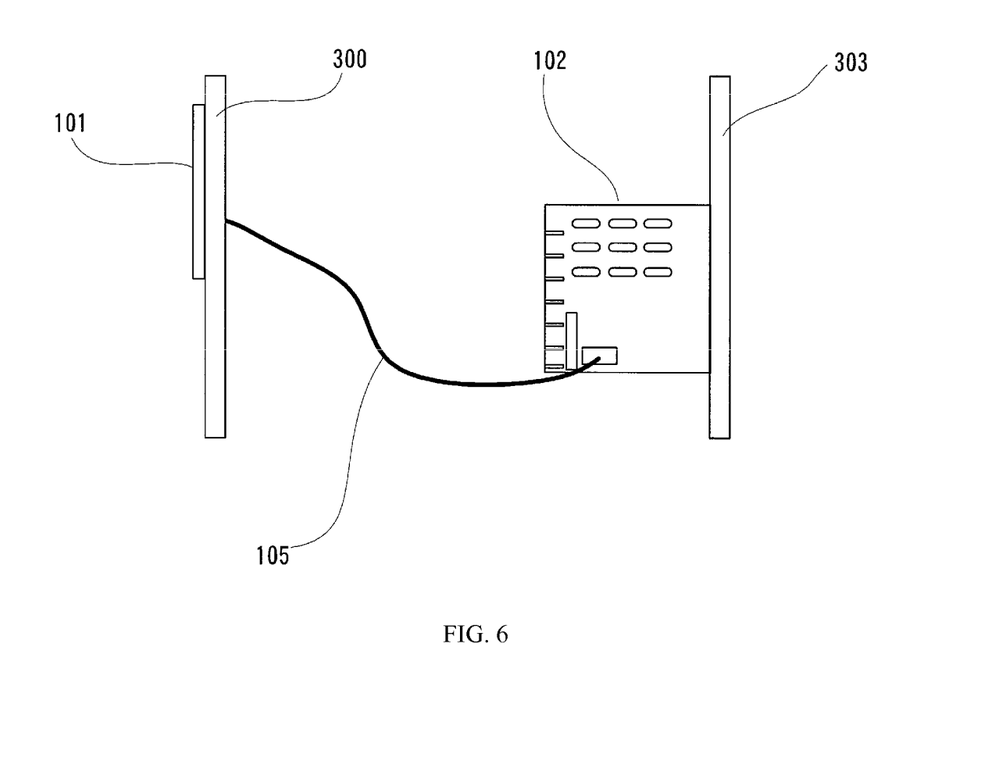
FIG. 6 is a drawing showing an example for which the main unit is installed at a position separated from the panel on the back surface side of the panel.

FIG. 6 shows an example with the main unit 102 provided at a position on the back surface side of the panel 300 separated from the panel 300. With this example, the main unit 102 is installed on a different panel 303 positioned at the back surface side of the panel 300.

Also, with the embodiment described above, the display part 103 and the operating part 104 were provided on the display and operating unit 101, but it is also possible to provide only the display part 103, or to provide only the operating part 104.

Also, with the embodiment described above, the main unit 102 was fixed using the DIN rail 505, but the fixing method is not limited to this.

Expansion of the Embodiments

Above, we described the present invention with reference to embodiments, but the present invention is not limited to the embodiments noted above. Various changes can be made to the constitution and details of the present invention within the scope of the technical concepts of the present invention that can be understood by a person skilled in the art.

EXPLANATION OF CODES

100 Indicator controller;
101 Display and operating part;
102 Main unit;
103 Display part;
104 Operating part;
105 Connector cable;
106 Terminal part;
300 Panel;
302 Opening;
402 Packing;
505 DIN rail;
$CN_1$, $CN_2$ Connector;
BT1 to BT4 Screw

The invention claimed is:

1. A control device comprising:
a display and operating unit comprising at least one of a display part and an operating part, the display and operating unit being attached to a front surface side of a panel using a fastening member; and
a main unit separably coupled with the display and operating-unit, the main unit being fixed to a back surface side of the panel by hanging on a DIN rail fixed to the back surface side of the panel using the fastening member, wherein
the main unit is separated from the display and operating unit, the display and operating unit comprises a connecting part configured to pass through an opening formed on the panel for connection with the main unit,
the connecting part comprises packing positioned so as to enclose a periphery of the opening with the panel so that the packing is gripped and pressed by the display and operating unit, and
the main unit is connected at the back surface side of the panel to the display and operating unit by the connecting part.

2. The control device according to claim 1, wherein the connecting part is a connector cable, and the main unit is connected to the display and operating unit via connection with the connector cable at the back surface side of the panel.

3. The control device according to claim 1, wherein the connecting part is a connector, and the main unit is connected to the display and the operating unit by a mutual connector connection at the back surface side of the panel.

4. The control device according to claim 1, wherein the control device is an indicator controller comprising both a display part and an operating part for the display and operating part.

* * * * *